(12) United States Patent
Kishi

(10) Patent No.: US 10,901,046 B2
(45) Date of Patent: Jan. 26, 2021

(54) INFORMATION PROCESSING APPARATUS, CONTROL METHOD, AND PROGRAM

(71) Applicant: NEC ENERGY DEVICES, LTD., Sagamihara (JP)

(72) Inventor: Mayuko Kishi, Sagamihara (JP)

(73) Assignee: Envision AESC Energy Devices, Ltd., Sagamihara (JP)

( * ) Notice: Subject to any disclaimer, the term of this patent is extended or adjusted under 35 U.S.C. 154(b) by 195 days.

(21) Appl. No.: 16/317,103

(22) PCT Filed: Jun. 7, 2017

(86) PCT No.: PCT/JP2017/021148
§ 371 (c)(1),
(2) Date: Jan. 11, 2019

(87) PCT Pub. No.: WO2018/012151
PCT Pub. Date: Jan. 18, 2018

(65) Prior Publication Data
US 2019/0242950 A1 Aug. 8, 2019

(30) Foreign Application Priority Data
Jul. 12, 2016 (JP) ................. 2016-137236

(51) Int. Cl.
*H02J 7/04* (2006.01)
*G01R 31/396* (2019.01)
(Continued)

(52) U.S. Cl.
CPC ........... *G01R 31/396* (2019.01); *G01R 31/36* (2013.01); *G01R 31/3835* (2019.01);
(Continued)

(58) Field of Classification Search
CPC ........ H02J 7/0081; H02J 7/008; H02J 7/0093; H01M 10/44; Y02E 60/12
See application file for complete search history.

(56) References Cited

U.S. PATENT DOCUMENTS 5,172,044 A * 12/1992 Sasaki ................ G01R 31/3646
320/160
5,430,363 A * 7/1995 Kim ...................... H01M 10/44
320/128
(Continued)

FOREIGN PATENT DOCUMENTS

JP 2001-218376 A 8/2001
JP 2002-25628 A 1/2002
(Continued)

OTHER PUBLICATIONS

International Search Report for PCT/JP2017/021148 dated Jul. 11, 2017 [PCT/ISA/210].

*Primary Examiner* — Arun C Williams
(74) *Attorney, Agent, or Firm* — Sughrue Mion, PLLC

(57) ABSTRACT

An information processing apparatus (2000) detects a battery cell in which an abnormality (for example, leakage) occurs among a plurality of battery cells connected in series. A first differential voltage acquisition unit (2020) acquires a first differential voltage for each of the plurality of battery cells. The first differential voltage of the battery cell is a difference between a voltage of the battery cell after charging is completed and a voltage of the battery cell at a time when an operation is performed for a predetermined time after charging is completed. A determination unit (2040) determining that an abnormality occurs in a first battery cell, in a case where a difference between the first differential voltage of the first battery cell and the first differential
(Continued)

voltage of a battery cell having a next largest first differential voltage of the first battery cell, is greater than or equal to a first predetermined value.

11 Claims, 15 Drawing Sheets

(51) Int. Cl.
    *H01M 10/48*     (2006.01)
    *G01R 31/36*     (2020.01)
    *H01M 10/42*     (2006.01)
    *H02J 7/00*     (2006.01)
    *G01R 31/3835*     (2019.01)

(52) U.S. Cl.
    CPC ....... *H01M 10/42* (2013.01); *H01M 10/4228* (2013.01); *H01M 10/48* (2013.01); *H01M 10/482* (2013.01); *H02J 7/00* (2013.01)

(56) References Cited

U.S. PATENT DOCUMENTS

| | | | |
|---|---|---|---|
| 9,170,304 B2* | 10/2015 | Nukui | G01R 31/387 |
| 10,211,490 B2* | 2/2019 | Okada | H01M 10/4285 |
| 10,649,034 B2* | 5/2020 | Miyamoto | G01R 31/3835 |
| 2003/0052646 A1* | 3/2003 | Minamiura | B60L 3/0046 |
| | | | 320/122 |
| 2003/0085690 A1* | 5/2003 | Shiojima | H02J 7/0086 |
| | | | 320/164 |
| 2011/0267006 A1* | 11/2011 | Tanno | H01M 10/44 |
| | | | 320/116 |
| 2011/0282604 A1 | 11/2011 | Nagai et al. | |
| 2012/0200266 A1* | 8/2012 | Berkowitz | H02J 7/0021 |
| | | | 320/139 |

FOREIGN PATENT DOCUMENTS

| | | |
|---|---|---|
| JP | 2002-334726 A | 11/2002 |
| JP | 2006-138750 A | 6/2006 |
| JP | 2007-309839 A | 11/2007 |
| JP | 2011-238570 A | 11/2011 |

* cited by examiner

DETERMINE THAT ABNORMALITY OCCURS
NOT ONLY IN BATTERY CELL D BUT ALSO
IN BATTERY CELL E

INFORMATION PROCESSING APPARATUS, CONTROL METHOD, AND PROGRAM

CROSS REFERENCE TO RELATED APPLICATIONS

This application is a National Stage of International Application No. PCT/JP2017/021148, filed on Jun. 7, 2017, which claims priority from Japanese Patent Application No. 2016-137236, filed on Jul. 12, 2016, the entire contents of which are incorporated herein by reference.

TECHNICAL FIELD

The present invention relates to a management of battery cells.

BACKGROUND ART

Some storage batteries are configured by connecting a plurality of secondary batteries in series. Hereinafter, the secondary battery is referred to as a battery cell. While using such a storage battery, an abnormality such as leakage may occur in some battery cells included in the storage battery. When an abnormality occurs in a battery cell, it is necessary to take measures such as replacing the battery cell with a new battery cell.

Therefore, a technology for detecting an occurrence of an abnormality in a battery cell has been developed. An apparatus disclosed in Patent Document 1 detects a battery cell in which an abnormality occurs by using an average value of voltages at the time of no-load of each battery cell configuring an assembled battery. Specifically, the apparatus determines that an abnormality occurs in a certain battery cell, in a case where a difference between a voltage at the time of no load of the battery cell and the average value is greater than or equal to a determination threshold value.

An apparatus disclosed in Patent Document 2 determines a deterioration state of a battery cell by using an average value of a voltage at the time of discharging of each battery cell configuring an assembled battery. Specifically, the apparatus determines that a certain battery cell is deteriorated, in a case where a difference between a voltage at the time of discharging of the battery cell and the average value is greater than or equal to a determination threshold value.

RELATED DOCUMENT

Patent Document

[Patent Document 1] Japanese Patent Application Publication No. 2002-334726
[Patent Document 2] Japanese Patent Application Publication No. 2007-309839

SUMMARY OF THE INVENTION

Technical Problem

Both of the apparatuses disclosed in Patent Documents 1 and 2 need to calculate an average value of voltages of battery cells. Thus, a process for detecting a battery cell in which an abnormality occurs is complicated.

The present invention has been made in view of the foregoing problem. An object of the present invention is to provide a technology that can easily detect a battery cell in which an abnormality occurs.

Solution to Problem

According to the present invention, there is provided an information processing apparatus including (1) a first differential voltage acquisition unit acquiring a first differential voltage which is a difference between a voltage after charging is completed and a voltage at a time when an operation is performed for a predetermined time after charging is completed, for each of a plurality of battery cells connected in series, and (2) a determination unit determining that an abnormality occurs in a first battery cell, in a case where a difference between the first differential voltage of the first battery cell and the first differential voltage of a second battery cell having a next largest first differential voltage of the first battery cell, is greater than or equal to a first predetermined value.

According to the present invention, there is provided a control method executed by a computer. The control method includes (1) a first differential voltage acquisition step of acquiring a first differential voltage which is a difference between a voltage after charging is completed and a voltage at a time when an operation is performed for a predetermined time after charging is completed, for each of a plurality of battery cells connected in series, and (2) a determination step of determining that an abnormality occurs in a first battery cell, in a case where a difference between the first differential voltage of the first battery cell and the first differential voltage of a second battery cell having a next largest first differential voltage of the first battery cell, is greater than or equal to a first predetermined value.

According to the present invention, there is provided a program causing a computer to execute each step included in the control method of the present invention.

Advantageous Effects of Invention

According to the present invention, a technology that can easily detect a battery cell in which an abnormality occurs is provided.

BRIEF DESCRIPTION OF THE DRAWINGS

The above-mentioned object, and other objects, features and advantages will become more apparent on the basis of preferred embodiments described below and the following accompanying drawings.

DESCRIPTION OF EMBODIMENTS

Figure 1:
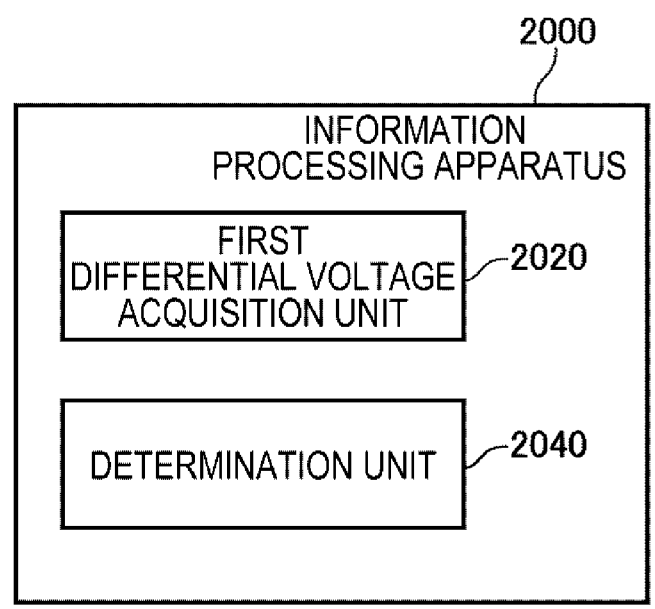
FIG. 1 is a block diagram illustrating an information processing apparatus according to Example Embodiment 1.

Hereinafter, example embodiments of the present invention will be described with reference to the drawings. The same constituent elements are given the same reference numerals throughout all the drawings, and description thereof will not be repeated as appropriate.

Example Embodiment 1

FIG. 1 is a block diagram illustrating an information processing apparatus 2000 according to Example Embodiment 1. In FIG. 1, each block does not represent a hardware unit configuration but represent a functional unit configuration.

The information processing apparatus 2000 detects a battery cell in which an abnormality (for example, leakage) occurs among a plurality of battery cells connected in series. To do so, the information processing apparatus 2000 includes a first differential voltage acquisition unit 2020 and a determination unit 2040.

The first differential voltage acquisition unit 2020 acquires a first differential voltage for each of the plurality of battery cells. The first differential voltage of the battery cell is a difference between a voltage of the battery cell when charging is completed (for example, a voltage of the battery cell at the time when charging has been completed) and a voltage of the battery cell when operating for a predetermined time after charging is completed. Note that, "a voltage of the battery cell when charging is completed" may be a voltage of the battery cell at any time from the time when charging of the battery cell has been completed to the time when the battery cell has started to be used. It is preferable that the above-mentioned "a voltage of the battery cell when charging has been completed" is set to "a voltage of a battery cell when charging is completed".

Figure 2:
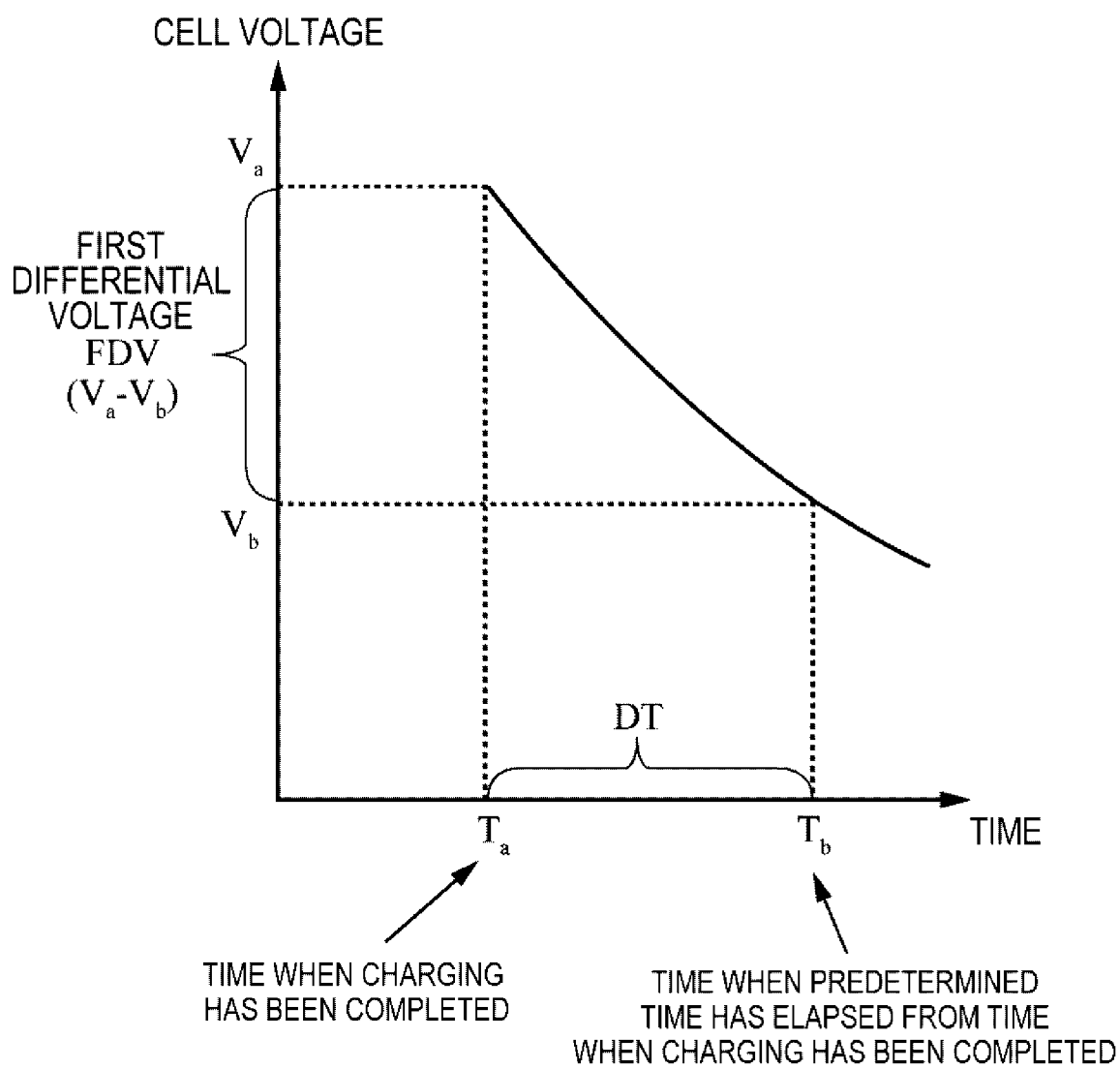
FIG. 2 is a diagram illustrating a first differential voltage of a battery cell.

FIG. 2 is a diagram illustrating the first differential voltage of a certain battery cell. In FIG. 2, a time $T_a$ is a time when charging of the battery cell has been completed. A time $T_b$ is a time when a predetermined time DT has elapsed from the time $T_a$. The predetermined time DT is any length. For example, the predetermined time DT is 4 hours. In FIG. 2, $V_a$ is a voltage of the battery cell at the time $T_a$, $V_b$ is a voltage of the battery cell at the time $T_b$, and FDV is the first differential voltage. Here, FDV is a difference between $V_a$ and $V_b$, i.e. $V_a-V_b$.

The determination unit 2040 determines whether or not an abnormality occurs in the battery cell based on the first differential voltage of each battery cell. Specifically, between a first battery cell and a second battery cell having a next largest first differential voltage to the first battery cell, the determination unit 2040 calculates a difference of the first differential voltage. That is, if the first differential voltage of the first battery cell is denoted as FDV1 and the first differential voltage of the second battery cell is denoted as FDV2, the determination unit 2040 calculates (FDV1−FDV2). Then, the determination unit 2040 determines that an abnormality occurs in the first battery cell when the calculated (FDV1−FDV2) is greater than or equal to a first predetermined value.

Advantageous Effect

According to the information processing apparatus 2000 of the present example embodiment, it is possible to determine whether or not an abnormality occurs in the first battery cell by comparing a magnitude of a difference of the first differential voltage between the first battery cell and the second battery cell having the next largest first differential voltage to the first battery cell, and the first predetermined value. In the determination, calculation of a statistical value is unnecessary. Therefore, according to the information processing apparatus 2000 of the present example embodiment, it is possible to easily detect a battery cell in which an abnormality occurs using a simple process.

Here, as another method of determining whether or not an abnormality occurs in the battery cell 10, there is a method of individually checking the first differential voltage of each battery cell 10 instead of comparing the first differential voltage between the battery cells 10. Specifically, there is a method of "in a case where a first differential voltage of a certain battery cell 10 is greater than or equal to a predetermined value, it is determined that an abnormality occurs in the battery cell 10". However, inventors of the present invention have discovered that a case, in which an aging deterioration within a range of prediction is erroneously determined as an abnormality such as leakage when the battery cell 10 is operated for a long period of time, will increase if using the above method. An aging deterioration due to a long-term operation is predicted from characteristics of the battery cell 10, and it is preferable to distinguish the aging deterioration from unexpected abnormalities such as leakage.

In a case of an aging deterioration, the first differential voltage increases for any of the battery cells 10. Therefore, if an abnormality of the battery cell 10 is detected by comparing the first differential voltage between the battery cells 10 then a probability that an increase of the first differential voltage due to the aging deterioration is erroneously detected as an abnormality of the battery cell 10 is lowered.

The information processing apparatus 2000 of the present example embodiment determines whether or not an abnormality occurs in the first battery cell based on a difference between the first differential voltage of the first battery cell and the first differential voltage of the second battery cell. Therefore, according to the information processing apparatus 2000 of the present example embodiment, it is possible to detect unexpected abnormalities such as leakage with high accuracy since the probability that an aging deterioration is erroneously determined as an unexpected abnormality such as leakage is low.

Hereinafter, the present example embodiment will be described in more detail.

<Example of Hardware Configuration of Information Processing Apparatus 2000>

Each functional configuration unit of the information processing apparatus 2000 may be realized by hardware (for example, a hard wired electronic circuit, or the like) that realizes each functional configuration unit, or may be realized by a combination of hardware and software (for example, a combination of an electronic circuit and a program for controlling the electronic circuit, or the like). Hereinafter, a case where each functional configuration unit of the information processing apparatus 2000 is realized by a combination of hardware and software will be further described.

Figure 3:
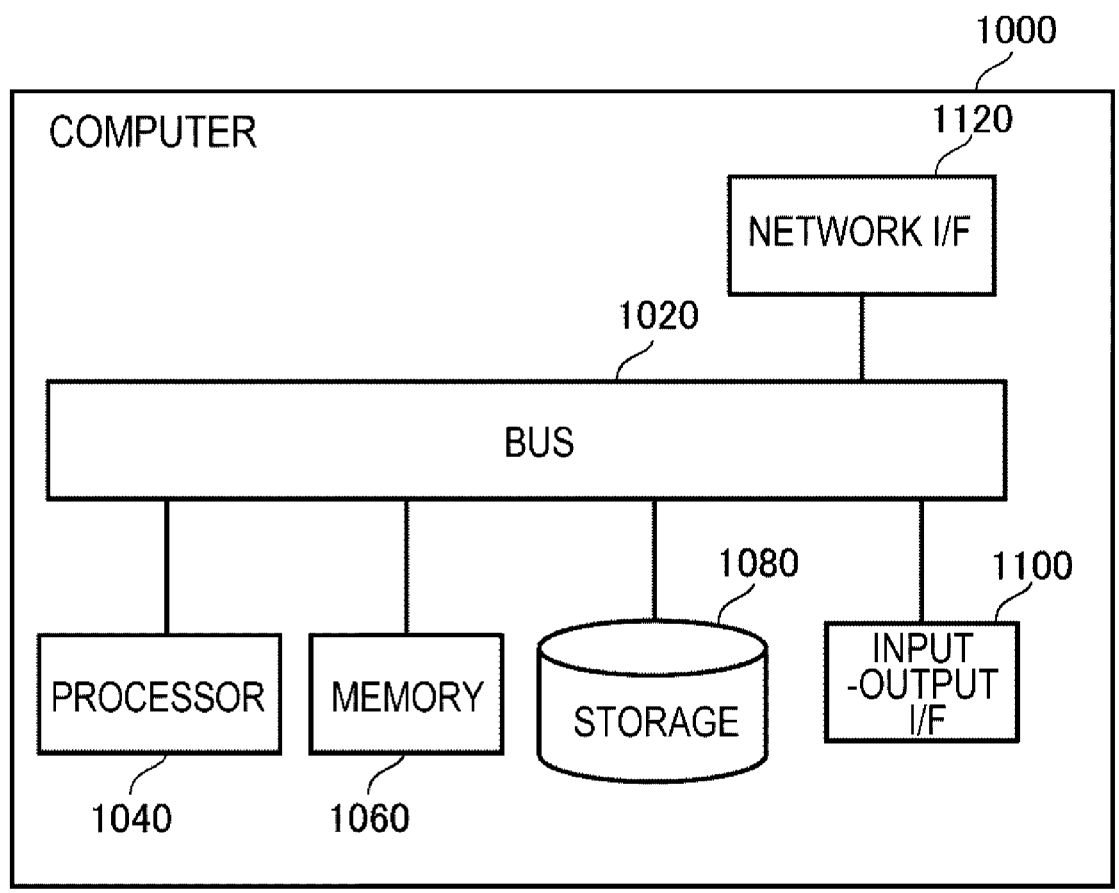
FIG. 3 is a diagram illustrating a computer for realizing the information processing apparatus.

FIG. 3 is a diagram illustrating a computer 1000 for realizing the information processing apparatus 2000. The computer 1000 is various computers. For example, the computer 1000 is a server machine, a personal computer (PC), a tablet terminal, a smartphone, or the like. The computer 1000 may be a dedicated computer designed to realize the information processing apparatus 2000 or may be a general purpose computer.

The computer 1000 includes a bus 1020, a processor 1040, a memory 1060, a storage 1080, an input and output interface 1100 and a network interface 1120. The bus 1020 is a data transmission path for transmitting and receiving data among the processor 1040, the memory 1060, the storage 1080, the input and output interface 1100 and the network interface 1120. However, a method of connecting the processor 1040 and the like to each other is not limited to connection using the bus. The processor 1040 is, for example, a calculation processing apparatus such as a central processing unit (CPU) or a graphics processing unit (GPU). The memory 1060 is, for example, a random access memory (RAM) or a read only memory (ROM). The storage 1080 is, for example, a storage apparatus such as a hard disk, a solid state drive (SSD), or a memory card. The storage 1080 may be a memory such as a RAM or a ROM.

The input and output interface 1100 connects the computer 1000 to input and output devices. For example, a keyboard, a mouse, or the like are connected to the input and output interface 1100.

The network interface 1120 is an interface for connecting the computer 1000 such that it can communicate with an external apparatus. The network interface 1120 may be a network interface for connecting to a wired line or a network interface for connecting with a wireless line.

A hardware configuration of the computer 1000 is not limited to the configuration shown in FIG. 3. For example, each program module may be stored in the memory 1060. In this case, the computer 1000 may not have the storage 1080.

<Flow of Processing>

Figure 4:
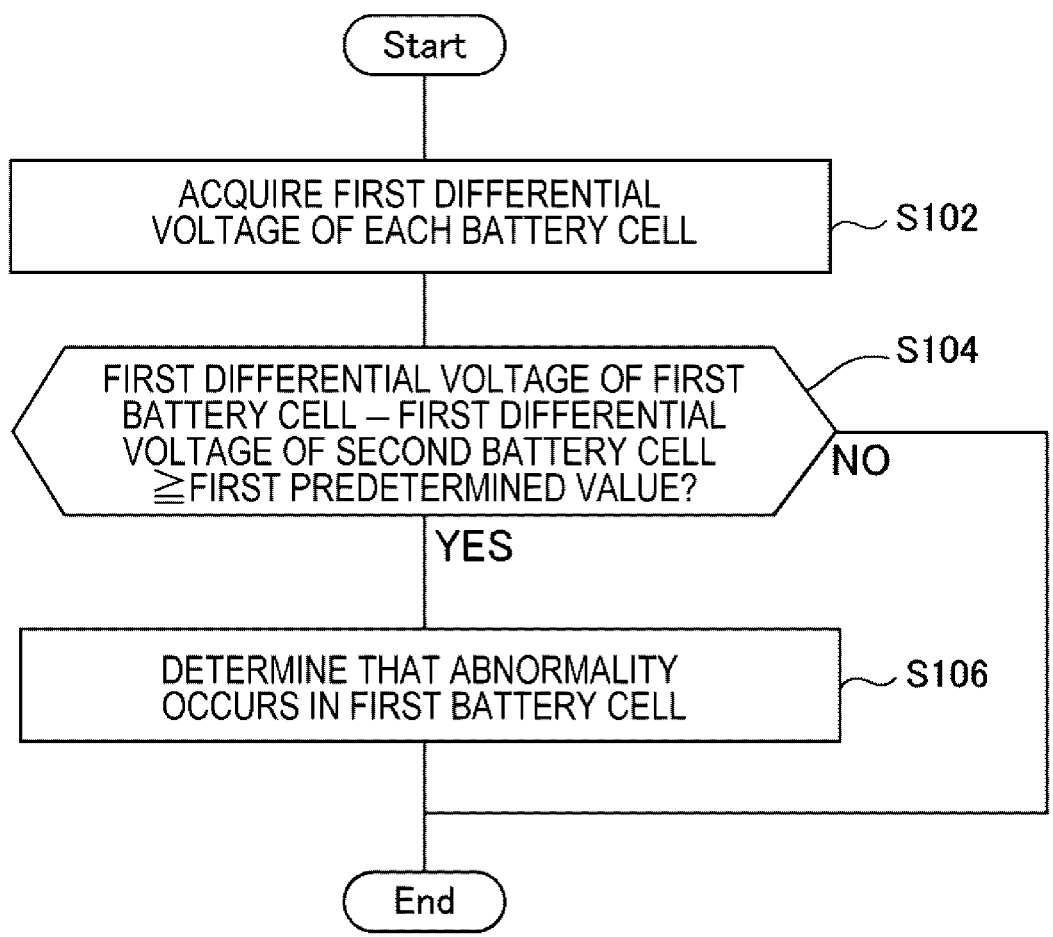
FIG. 4 is a flowchart illustrating a flow of processing executed by the information processing apparatus according to Example Embodiment 1.

FIG. 4 is a flowchart illustrating a flow of processing executed by the information processing apparatus 2000 according to Example Embodiment 1. The first differential voltage acquisition unit 2020 acquires the first differential voltage of each battery cell (S102). The determination unit 2040 determines whether or not a difference between the first differential voltage of the first battery cell and the first differential voltage of the second battery cell is greater than or equal to a first predetermined value (S104). When the difference between the first differential voltage of the first battery cell and the first differential voltage of the second battery cell is greater than or equal to the first predetermined value (S104: YES), the determination unit 2040 determines that an abnormality occurs in the first battery cell (S106).

When a difference between the first differential voltage of the first battery cell and the first differential voltage of the second battery cell is less than the first predetermined value (S104: NO), any handling of the first battery cell may be used. For example, the determination unit 2040 determines that the first battery cell is normal. Alternatively, for example, the determination unit 2040 may perform another process to determine whether or not an aging deterioration has occurred in the first battery cell, or the like.

<Battery Cell>

Figure 5:
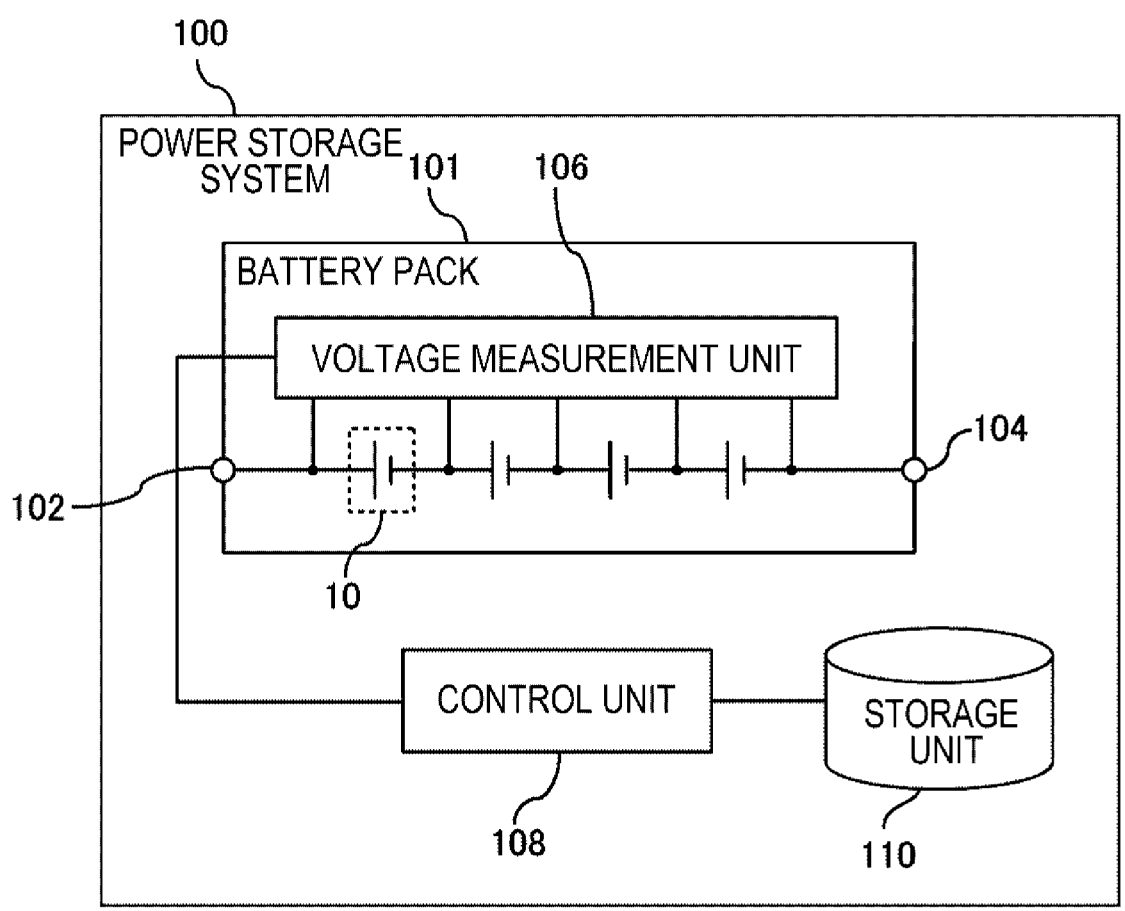
FIG. 5 is a diagram illustrating a configuration of a power storage system.

A configuration and a usage environment of the battery cell handled by the information processing apparatus 2000 will be illustrated. FIG. 5 is a diagram illustrating a power storage system 100 including battery cells. The power storage system 100 has the battery cell 10 and a functional configuration unit for controlling the battery cell 10.

In the power storage system 100, the battery cells 10 connected in series are stored in a battery pack 101. The battery cell 10 is a rechargeable secondary battery such as a lithium ion secondary battery or a nickel hydrogen battery. Any component may be used for a positive electrode terminal and a negative electrode terminal of the battery cell 10. For example, the positive electrode terminal of the battery cell 10 is a terminal containing Mn spinel as a main component, and the negative electrode terminal of the battery cell 10 is a terminal containing graphite as a main component.

Furthermore, the battery pack 101 includes a positive electrode terminal 102, a negative electrode terminal 104, and a voltage measurement unit 106. The positive electrode terminal 102 and the negative electrode terminal 104 are terminals to be connected to a load (such as an electronic device) that consumes electric power or a power source (power generation apparatus, system power supply, or the like.) that supplies electric power. The electric power stored in the battery cell 10 is supplied to the load connected to the positive electrode terminal 102 and the negative electrode terminal 104. In addition, the battery cell 10 is charged by electric power supplied from a power source connected to the positive electrode terminal 102 and the negative electrode terminal 104. The voltage measurement unit 106 is a measurement device that measures a voltage of each battery cell 10.

The power storage system 100 includes a control unit 108 and a storage unit 110 in addition to the battery pack 101. The control unit 108 controls the battery pack 101 and manages a state of the battery pack 101. For example, the control unit 108 is configured using a micro control unit (MCU) or the like. The storage unit 110 is a storage device for storing various data relating to the battery pack 101. The control unit 108 stores a voltage of the battery cell 10 measured by the voltage measurement unit 106 in the storage unit 110 and transmits data relating to the voltage of the battery cell 10 to an external apparatus (for example, the information processing apparatus 2000).

The voltage measurement unit 106 may repeatedly measure a voltage of each battery cell 10 at a regular timing (for example, once every hour) or may measure a voltage of each battery cell 10 at a specified specific timing. In the latter case, for example, the control unit 108 transmits a control signal to the voltage measurement unit 106 at the time when charging of the battery cell 10 is completed and at the time when a predetermined time has elapsed from the time when charging of the battery cell 10 is completed. The voltage measurement unit 106 measures a voltage of each battery cell 10 at the timing of receiving the control signal. Accordingly, a voltage of each battery cell 10 is measured at the above-mentioned two times.

Note that, the configuration of the power storage system 100 illustrated in FIG. 5 is merely an example, and the configuration of the power storage system 100 is not limited to the configuration illustrated in FIG. 5. For example, in the battery pack 101, the terminal to which the load is connected and the terminal to which the power source is connected, may be different from each other. In addition, the power storage system 100 may include a plurality of battery packs 101.

The power storage system 100 may be used for any usage. For example, the power storage system 100 is used for storing and discharging an electric power generated by a power generation apparatus such as a photovoltaic power generation apparatus. In this case, the electric power generated by the power generation apparatus is stored in each battery cell 10. The power storage system 100 may be a household system installed in a house or the like, or may be a business system installed in a factory or the like.

The information processing apparatus 2000 collects various data (for example, a voltage of the battery cell 10) from one or more power storage systems 100, thereby managing the power storage system 100 (detects that an abnormality occurs in the battery cell 10, or the like).

Figure 6:
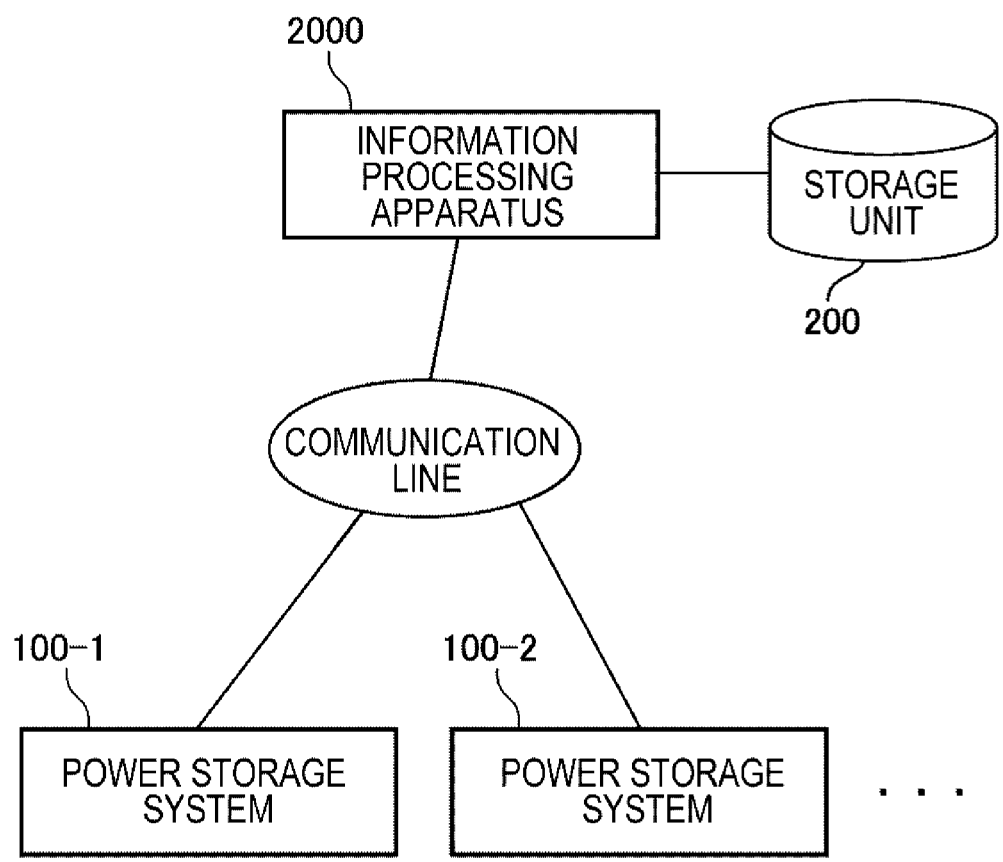
FIG. 6 is a diagram illustrating the information processing apparatus connected to a plurality of power storage systems through communication lines.

FIG. 6 is a diagram illustrating the information processing apparatus 2000 connected to a plurality of power storage systems 100 through communication lines. The information processing apparatus 2000 collects data relating to the battery cell 10 from each power storage system 100. The collected data is stored in the storage unit 200. The storage unit 200 may be provided inside the information processing apparatus 2000 or may be provided outside the information processing apparatus 2000.

Figure 7:
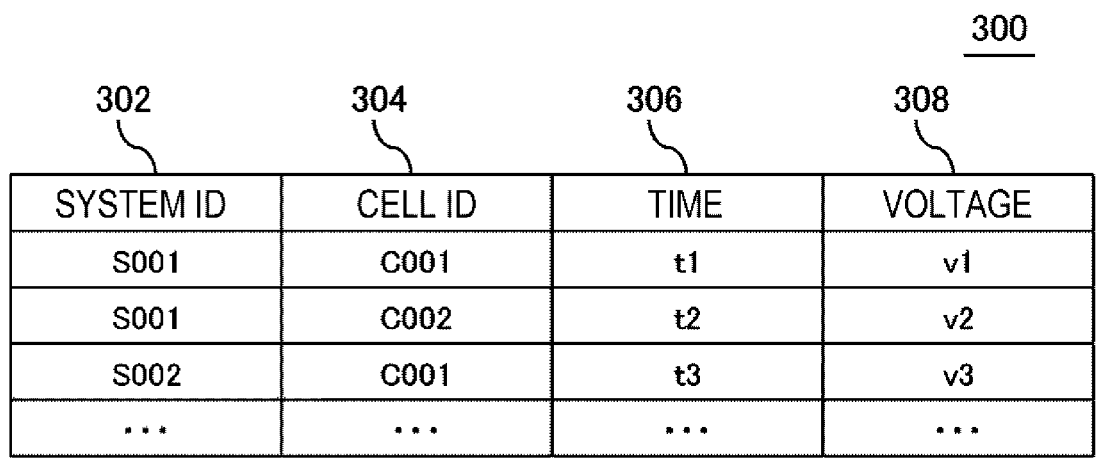
FIG. 7 is a diagram illustrating data stored in a storage unit in a table format.

FIG. 7 is a diagram illustrating data stored in the storage unit 200 in a table format. A table shown in FIG. 7 is set a table 300. The table 300 includes a system ID 302, a cell ID 304, a time 306, and a voltage 308. Each record of the table 300 indicates a voltage of the battery cell 10 measured at a certain time. The system ID 302 indicates an identifier (ID) of the power storage system 100 including the battery cell 10. The cell ID 304 indicates the ID of the battery cell 10. The time 306 indicates the time when a voltage of the battery cell 10 was measured. The voltage 308 indicates the measured value of a voltage of the battery cell 10. Here, if the number of power storage systems 100 managed by the information processing apparatus 2000 is one, the table 300 may not have the system ID 302.

Note that, the information processing apparatus 2000 does not necessarily need to be connected to the power storage system 100 through a communication line. For example, when there is one power storage system 100 managed by the information processing apparatus 2000, the information processing apparatus 2000 may be provided inside the power storage system 100 to be managed. In this case, the control unit 108 included in the power storage system 100 may have a function of the information processing apparatus 2000.

<Acquisition of First Differential Voltage: S102>

The first differential voltage of the battery cell 10 is calculated using a voltage of the battery cell 10 after charging is completed and a voltage of the battery cell 10 at the time when an operation is performed for a predetermined time after charging is completed. As described above, these voltages are measured by the voltage measurement unit 106.

Any apparatus that calculates the first differential voltage may be used. For example, calculation of the first differential voltage is performed by the information processing apparatus 2000. In this case, the information processing apparatus 2000 acquires a voltage of the battery cell 10 measured by the voltage measurement unit 106. Here, the information processing apparatus 2000 may directly acquire a voltage of the battery cell 10 from the power storage system 100, or may acquire a voltage of the battery cell 10 through an apparatus other than the power storage system 100.

Calculation of the first differential voltage may be performed by an apparatus other than the information processing apparatus 2000. In this case, the first differential voltage acquisition unit 2020 acquires the calculated first differential voltage from an apparatus that performed calculation of the first differential voltage.

Calculation of the first differential voltage may be performed inside the power storage system 100. In this case, the control unit 108 stores the calculated first differential voltage in the storage unit 110 or transmits the calculated first differential voltage to the information processing apparatus 2000. In this case, the control unit 108 may not need to transmit the voltage of the battery cell 10 to the information processing apparatus 2000 or the like.

<Determination by Determination Unit 2040: S104-S106>

When a difference between the first differential voltage of the first battery cell and the first differential voltage of the second battery cell is greater than or equal to the first predetermined value (S104: YES), the determination unit 2040 determines that an abnormality occurs in the first battery cell (S106). The first predetermined value may be set in the determination unit 2040 in advance or may be stored in a storage apparatus accessible from the determination unit 2040.

The first predetermined value is a value determined by characteristics of the battery cell 10 and the like. For example, it is preferable to set the first predetermined value to 5 mV, in a case where the main component of the positive electrode terminal of the battery cell 10 is Mn spinel, the main component of the negative electrode terminal of the battery cell 10 is graphite, and the predetermined time DT is 4 hours.

The first battery cell is the battery cell 10 included in the power storage system 100. There are various methods for determining which battery cell 10 is handled as a first battery cell by the determination unit 2040. For example, the determination unit 2040 handles the battery cell 10 having the largest first differential voltage among the battery cells 10 included in the power storage system 100 as a first battery cell. In this case, a second battery cell is the battery cell 10 having the second largest first differential voltage.

Here, regarding the battery cell 10 in which an output voltage decreases largely after charging is completed, a probability that an abnormality occurs is high. Therefore, it is possible to detect a battery cell 10 in which an abnormality occurs at an early stage by handling the battery cell 10 having the largest first differential voltage among the battery cells 10 included in the power storage system 100 as a first battery cell.

Note that, the determination unit 2040 may handle any one of the battery cells 10 included in the power storage system 100 as a first battery cell or may handle each of the plurality of battery cells 10 included in the power storage system 100 as a first battery cell. In the latter case, the determination unit 2040 determines whether or not an abnormality occurs in each battery cell 10 by sequentially handling each battery cell 10 included in the power storage system 100 as a first battery cell, for example.

Figure 8:
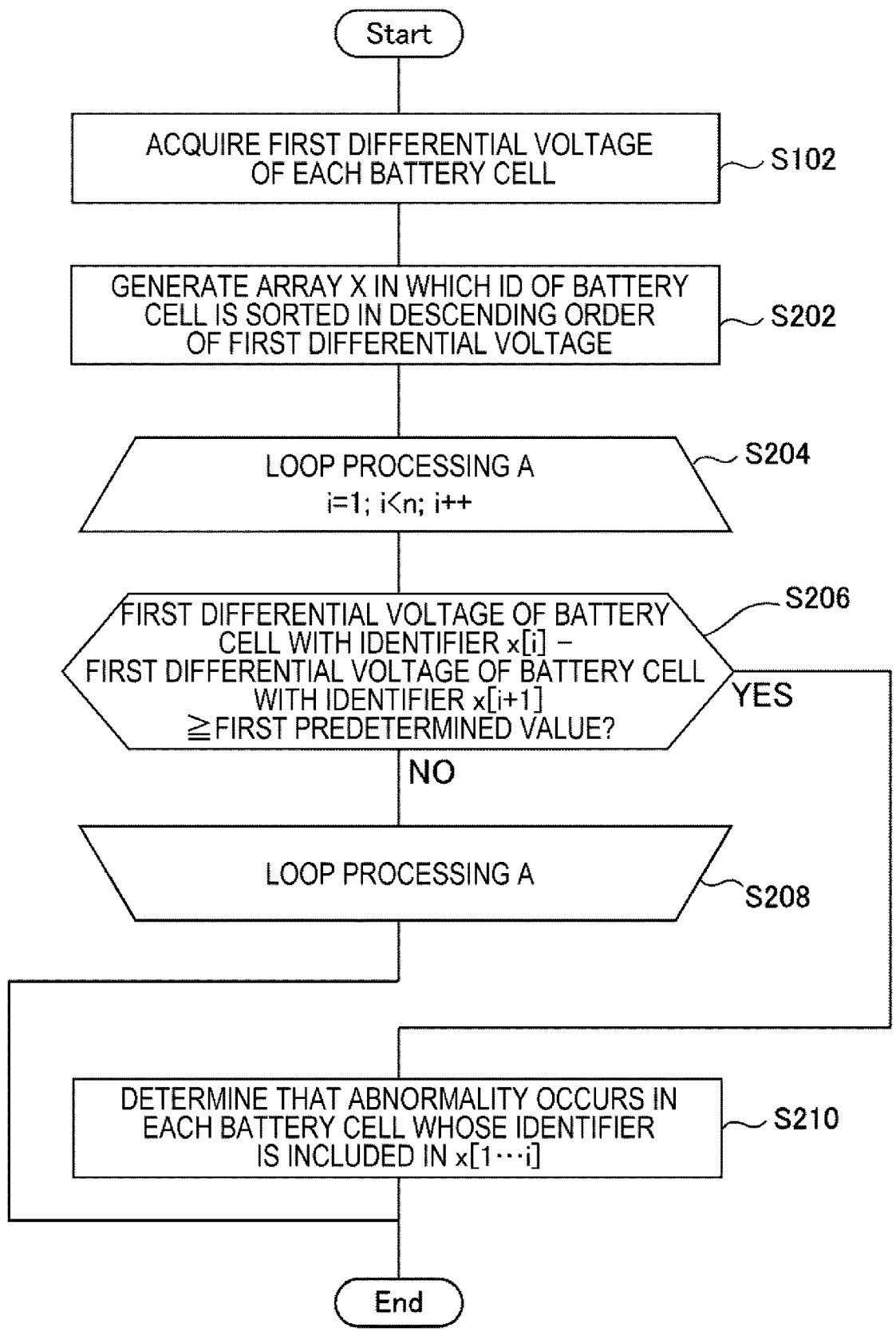
FIG. 8 is a flowchart illustrating a flow of processing executed by the information processing apparatus in a case where each battery cell included in the power storage system is sequentially handled as a first battery cell.

FIG. 8 is a flowchart illustrating a flow of processing executed by the information processing apparatus 2000 in a case where each battery cell 10 included in the power storage system 100 is sequentially handled as a first battery cell. The determination unit 2040 generates an array X in which the identifier (ID) of the battery cell 10 is sorted in descending order of the first differential voltage (S202).

S204 to S208 are a loop processing A executed for each battery cell 10. The determination unit 2040 handles the battery cells 10 of the identifiers included in the array X as a first battery cell in order from a head. Specifically, a battery cell 10 where the identifier is X[i] is handled as a first battery cell. In this case, a battery cell 10 where the identifier is X[i+1] is handled as a second battery cell. Note that, n is the number of elements of the array X (the total number of the battery cells 10). When a condition "i<n" is not satisfied (when i=n), the process of FIG. 8 ends.

In S206, the determination unit 2040 determines whether or not a difference between the first differential voltage of the battery cell 10 with the identifier X[i] (the first battery cell) and the first differential voltage of the battery cell 10 with the identifier X[i+1] (the second battery cell) is greater than or equal to the first predetermined value. When a difference between the first differential voltage of the first battery cell and the first differential voltage of the second battery cell is less than the first predetermined value (S206: NO), the process of FIG. 8 proceeds to S208. Since S208 is an end of the loop process A, the process of FIG. 8 returns to S204.

On the other hand, when a difference between the first differential voltage of the first battery cell and the first differential voltage of the second battery cell is greater than or equal to the predetermined value (S206: YES), the determination unit 2040 determines that an abnormality occurs in each battery cell 10 whose identifier is included in X[1] to X[i] (S208). The battery cells 10 whose identifiers are included in X[1] to X[i] include a battery cell 10 with the identifier X[i] (the battery cell 10 handled as a first battery cell at the end) and each of battery cells 10 whose first differential voltage is larger than the battery cell 10 with the identifier X[i].

In this way, it is possible to detect that an abnormality occurs in two or more battery cells 10, in a case where an abnormality occurs in two or more battery cells 10 included in the power storage system 100, by sequentially handling each of the plurality of battery cells 10 as a first battery cell. The reason will be explained using an example shown in FIG. 9.

Figure 9:
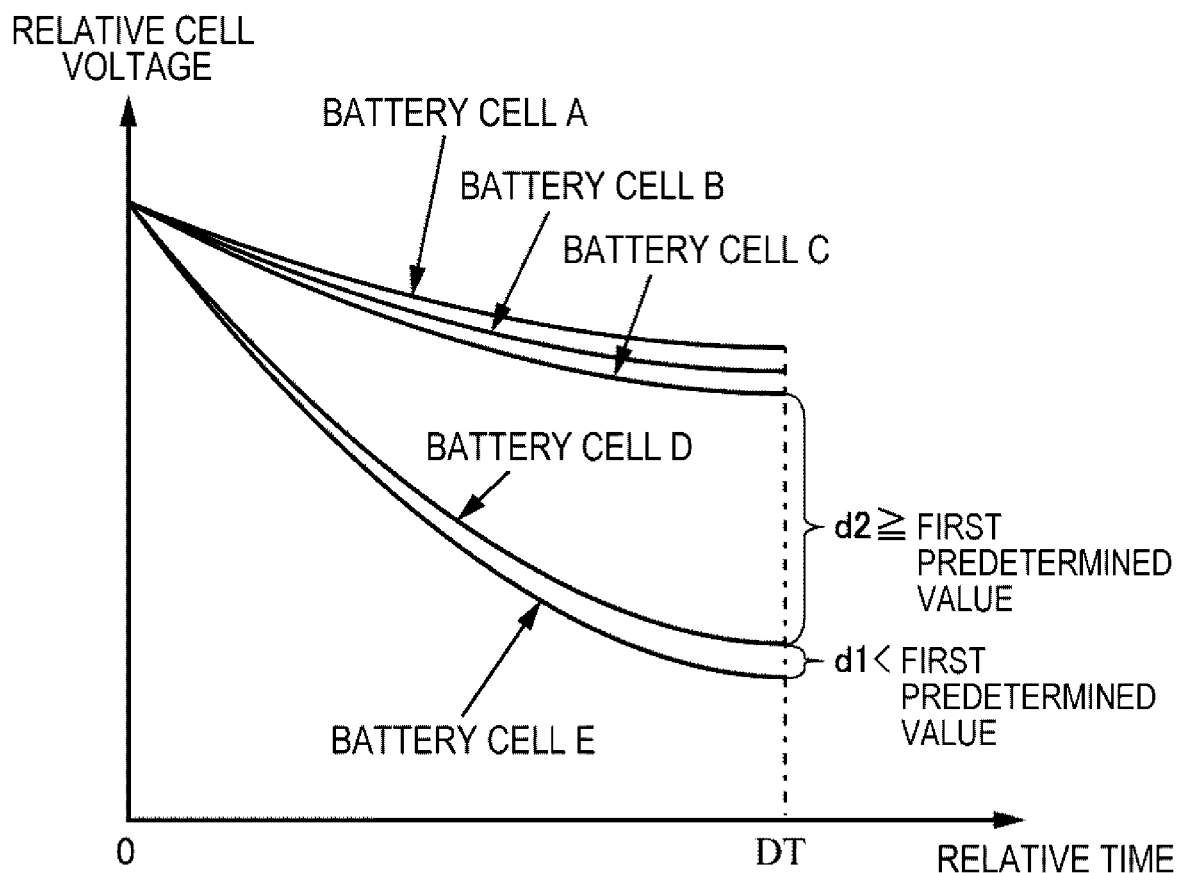
FIG. 9 is a diagram illustrating changes in voltages of each of a plurality of battery cells.
Figure 9:
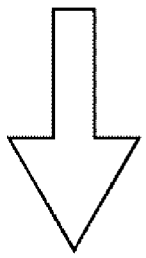

FIG. 9 is a diagram illustrating changes in voltages of each of the plurality of battery cells 10. Specifically, FIG. 9 shows changes in voltages of five battery cells 10 (battery cells A to E). From the battery cells A to E have a large first differential voltage in order. Note that, in FIG. 9, a time when charging of each battery cell 10 is completed is all set to 0, and each graph is translated so that a voltage of each battery cell 10 at the time is the same.

A difference (d1 in FIG. 9) is small between the first differential voltage of the battery cell E having the largest first differential voltage and the first differential voltage of the battery cell D having the next largest first differential voltage. That is, the difference is less than the first predetermined value. Therefore, when the battery cell E is handled as a first battery cell, it is not determined that an abnormality occurs in the battery cell E.

On the other hand, a difference (d2 in FIG. 9) is greater than or equal to the first predetermined value between the first differential voltage of the battery cell D and the first differential voltage of the battery cell C having the next largest first differential voltage. Therefore, when the battery cell D is handled as a first battery cell, it is determined that an abnormality occurs in the battery cell D.

However, referring to FIG. 9, it is considered that an abnormality occurs not only in the battery cell D but also in the battery cell E having the first differential voltage larger than that in the battery cell D. Therefore, as described above, if it is determined in S206 that "a difference between the first differential voltage of the first battery cell and the first differential voltage of the second battery cell is greater than or equal to the first predetermined value", the determination unit 2040 determines that an abnormality occurs not only the first battery cell (the battery cell D in the above-mentioned example) but also the other battery cell 10 (the battery cell E in the above-mentioned example) having the first differential voltage larger than the first battery cell. Thus, when an abnormality occurs in a plurality of battery cells 10, it is possible to detect that an abnormality occurs in the plurality of battery cells 10.

Note that, when the power storage system 100 has the plurality of battery packs 101, the information processing apparatus 2000 may perform a process (for example, a series of processes shown in FIG. 8) of detecting the battery cell 10 in which an abnormality occurs for each battery pack 101. In a case of detecting the battery cell 10 in which an abnormality occurs for each battery pack 101 as described above, comparison of the first differential voltages is performed only for the battery cells 10 in the same battery pack 101 (a first battery cell and a second battery cell are included in the same battery pack 101). In this way, even when characteristics of the battery cells 10 in the power storage system 100 are different for each battery pack 101, it is possible to detect a battery cell 10 in which an abnormality occurs with high accuracy.

<Notification of Determination Result>

Any method of notifying a determination result by the determination unit 2040 to a user of the information processing apparatus 2000 may be used. For example, the information processing apparatus 2000 displays the ID of the battery cell 10 which is determined that an abnormality occurs, to a display device connected to the information processing apparatus 2000 or a mobile device owned by a user of the information processing apparatus 2000.

<Handling of Battery Cell 10 Determined to be Abnormal>

Any handling of the battery cell 10 which is determined that an abnormality occurs may be used. For example, the battery cell 10 determined that an abnormality occurs is replaced with a new battery cell 10.

Example Embodiment 2

Figure 10:
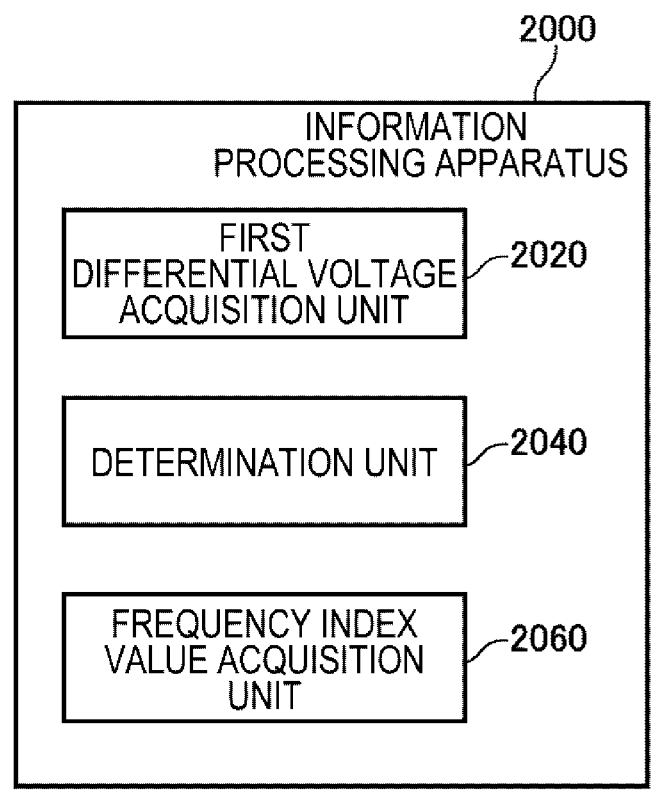
FIG. 10 is a diagram illustrating an information processing apparatus according to Example Embodiment 2.

FIG. 10 is a diagram illustrating an information processing apparatus 2000 according to Example Embodiment 2. The information processing apparatus 2000 of Example Embodiment 2 has the same function as that of the information processing apparatus 2000 of Example Embodiment 1 except for the following description.

The information processing apparatus 2000 according to Example Embodiment 2 determines whether or not an abnormality occurs in a battery cell 10 based on an operation frequency of a cell balance circuit that controls the battery cell 10 in addition to a first differential voltage. The cell balance circuit is a circuit for executing a balancing operation for equalizing voltages of a plurality of battery cells 10.

The information processing apparatus 2000 according to Example Embodiment 2 includes a frequency index value acquisition unit 2060. The frequency index value acquisition unit 2060 acquires a value (hereinafter referred to as a frequency index value) indicating the operation frequency of the cell balance circuit.

A determination unit 2040 according to Example Embodiment 2 determines that an abnormality occurs in a first battery cell when a difference (FDV1−FDV2) between a first differential voltage of a first battery cell and a first differential voltage of a second battery cell is greater than or equal to a first predetermined value and the operation frequency of the cell balance circuit for controlling the first battery cell is greater than or equal to the predetermined frequency. The first predetermined value represents the following frequency, for example, "a cell balance circuit continuously operates for more than a predetermined time (for example, 2 hours or 3 hours) in a day and the continuous operation continues for more than a predetermined number of days (for example, 2 days and 3 days)".

<Flow of Processing>

Figure 11:
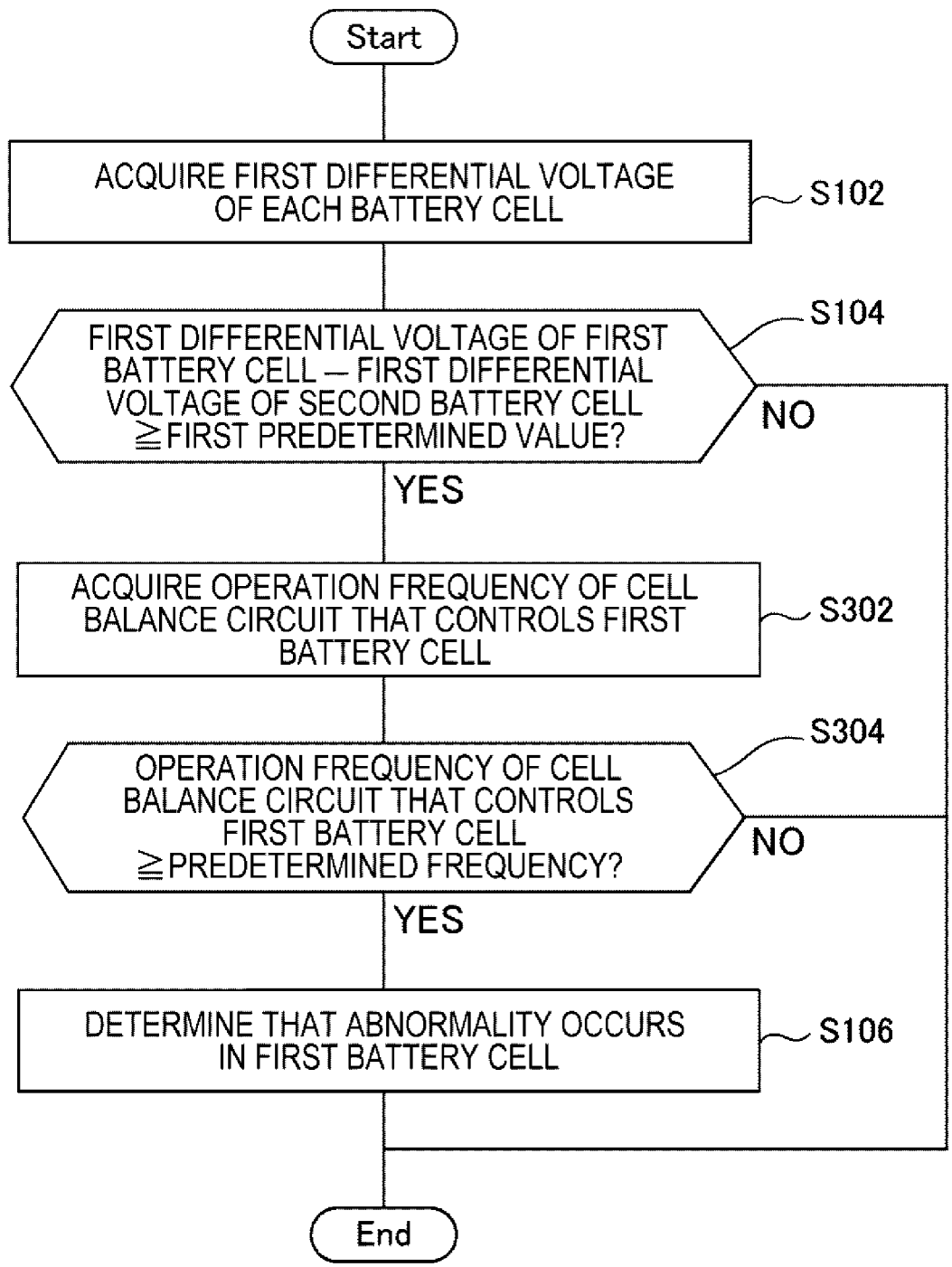
FIG. 11 is a flowchart illustrating a flow of processing executed by the information processing apparatus according to Example Embodiment 2.

FIG. 11 is a flowchart illustrating a flow of processing executed by the information processing apparatus 2000 according to Example Embodiment 2. In FIG. 11, steps other than S302 and S304 represent the same processing as the steps of the same sign in FIG. 4.

When a difference (FDV1−FDV2) between the first differential voltage of the first battery cell and the first differential voltage of the second battery cell is greater than or equal to the first predetermined value (S104: YES), the process of FIG. 11 proceeds to S302. In S302, the frequency index value acquisition unit 2060 acquires a frequency index value of the cell balance circuit that controls the first battery cell. The determination unit 2040 determines whether or not the operation frequency of the cell balance circuit that controls the first battery cell is greater than or equal to a predetermined frequency (S304) using the acquired frequency index value. When the operation frequency of the cell balance circuit that controls the first battery cell is greater than or equal to the predetermined frequency (S304: YES), the determination unit 2040 determines that an abnormality occurs in the first battery cell (S106).

When the operation frequency of the cell balance circuit that controls the first battery cell is less than the predetermined frequency (S304: NO), any handling of the first battery cell may be used. For example, the determination unit 2040 determines that an aging deterioration has occurred in the first battery cell or a follow-up observation of the first battery cell is necessary. Here, the battery cell 10 that needs a follow-up observation is a battery cell 10 in which a check whether or not an abnormality occurs needs to be performed more intensively than other battery cells 10 in the future, since it is not possible to determine that an abnormality occurs in the battery cell 10 at this time but there is a possibility that an abnormality occurs. Note that, any follow-up observation method may be used.

Note that, as described in Example Embodiment 1, the determination unit 2040 may sequentially handle each of the plurality of battery cells 10 included in the power storage system 100 as a first battery cell (refer to FIG. 8). In this case, the determination unit 2040 may perform a process after S302 for not only the first battery cell but also each battery cell 10 having the first differential voltage larger than that of the first battery cell. Specifically, in S210 of FIG. 8, the determination unit 2040 performs the process after S302 for each of the plurality of battery cells 10 whose identifiers are included in x[1 . . . i]. In this way, even when there are a plurality of battery cells 10 in which abnormalities occur, it is possible to detect these abnormalities.

For example, assume that one of the battery cells 10 whose identifier is included in x[1 . . . i] has a battery cell 10-j. In this case, in S302, the frequency index value acquisition unit 2060 acquires a frequency index value of the cell balance circuit that controls the battery cell 10-j. Using the acquired frequency index value, the determination unit 2040 determines whether or not the operation frequency of the cell balance circuit that controls the battery cell 10-j is greater than or equal to the predetermined frequency (S304). When the operation frequency of the cell balance circuit that controls the battery cell 10-j is greater than or equal to the predetermined frequency (S304: YES), the determination unit 2040 determines that an abnormality occurs in the battery cell 10-j (S106).

<Power Storage System 100>

Figure 12:
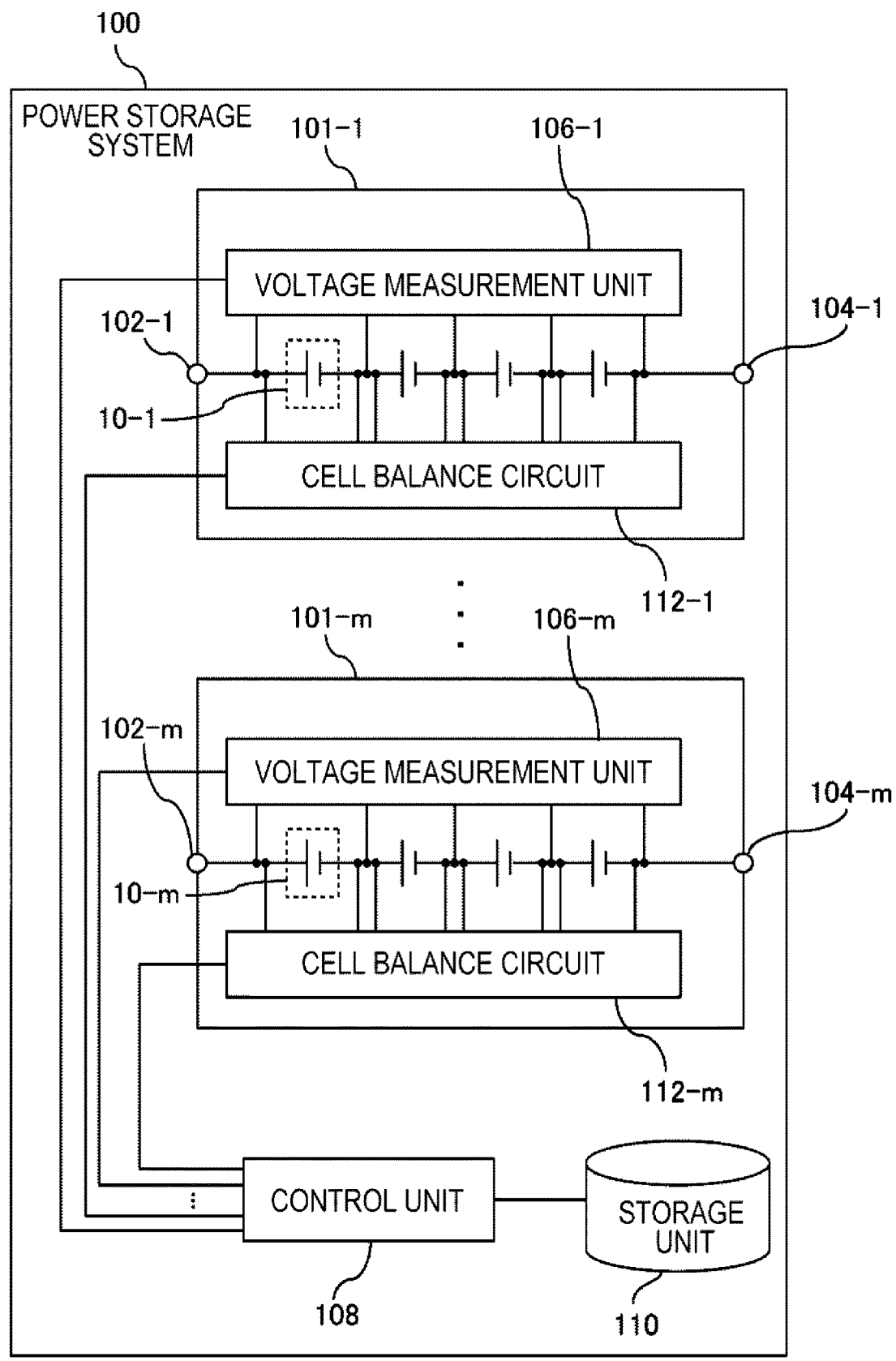
FIG. 12 is a diagram illustrating a power storage system according to Example Embodiment 2.

FIG. 12 is a diagram illustrating the power storage system 100 according to Example Embodiment 2. A battery pack 101 in FIG. 12 have a cell balance circuit 112. The cell balance circuit 112 executes a balancing operation for equalizing voltages of the battery cells 10 included in the battery pack 101. The cell balance circuit 112 may be a circuit for causing the battery cell 10 having high voltage to discharge through a resistor (passive balance circuit), or may be a circuit for discharging electric power to the battery cell 10 with high voltages and the electric power is charged into the battery cell 10 having a low voltage (active balancing circuit). The cell balance circuit 112 is configured to include switch elements or the like corresponding to each of the battery cells 10 so that a voltage of a battery cell 10 can be adjusted by switching ON/OFF of a switch element corresponding to a target battery cell.

A control unit 108 of FIG. 12 has a function of controlling the cell balance circuit 112 in addition to the function of the control unit 108 of FIG. 5. Specifically, the control unit 108 monitors a balance of voltages of the battery cells 10 in the battery pack 101 based on a voltage of each battery cell 10 measured by a voltage measurement unit 106. When determining that a voltage balance of a battery cell 10 included in a battery pack 101 has collapsed, the control unit 108 transmits an execution command of a balance operation to the cell balance circuit 112 of the battery pack 101. As a result, the cell balance circuit 112 operates.

Here, the configuration of the power storage system 100 shown in FIG. 12 is merely an example, and the configuration of the power storage system 100 is not limited to the configuration in FIG. 12. For example, the control unit for controlling the cell balance circuit 112 may be provided for each battery pack 101.

<Acquisition of Frequency Index Value: S302>

The determination unit 2040 acquires a frequency index value of the cell balance circuit 112 that controls the first battery cell (S302). Here, the frequency index value representing an operation frequency of each cell balance circuit 112 by the determination unit 2040 may be any information that can recognize the operation frequency of each cell balance circuit 112.

For example, the frequency index value is the number of operations of the cell balance circuit 112 per unit time (a value obtained by dividing the number of operations of the cell balance circuit 112 by the operation time of the cell balance circuit 112). The number of operations of the cell balance circuit 112 is counted by the control unit 108, for example. The frequency index value may be calculated by the control unit 108 or may be calculated by other than the control unit 108 (for example, the information processing apparatus 2000). The determination unit 2040 acquires the frequency index value from a functional configuration unit (for example, the control unit 108) that calculates the frequency index value.

Further, for example, the frequency index value is a value indicating the number of times the cell balance circuit 112 has operated. In this case, the determination unit 2040 calculates an operation frequency of the cell balance circuit 112 by dividing the frequency index value by the operation time of the cell balance circuit 112. The determination unit 2040 acquires the frequency index value from the control unit 108, for example.

<Determination by Determination Unit 2040: S304>

The determination unit 2040 determines whether or not the operation frequency of the cell balance circuit 112 that controls the first battery cell is greater than or equal to the predetermined frequency (S304). This predetermined frequency may be provided in the determination unit 2040 in advance, or may be stored in a storage apparatus accessible from the determination unit 2040.

<Hardware Configuration>

The information processing apparatus 2000 according to Example Embodiment 2 is realized by using the computer 1000 as in Example Embodiment 1 (refer to FIG. 3). In the present example embodiment, each program module stored in the above-mentioned storage 1080 further includes a program for realizing each function described in this example embodiment.

Advantageous Effect

If the battery pack 101 includes a battery cell 10 in which an abnormality occurs, the voltage balance of the battery cell 10 in the battery pack 101 tends to collapse due to the existence of the battery cell 10. Thus, the operation frequency of the cell balance circuit 112 that controls the battery pack 101 increases. Therefore, the information processing apparatus 2000 of the present example embodiment determines whether or not an abnormality occurs in the first battery cell by considering the operation frequency of the cell balance circuit for controlling the first battery cell in addition to the difference between the first differential voltage of the first battery cell and the first differential voltage of the second battery cell. Accordingly, it is possible to detect a battery cell 10 in which an abnormality occurs with high accuracy.

Example Embodiment 3

Figure 13:
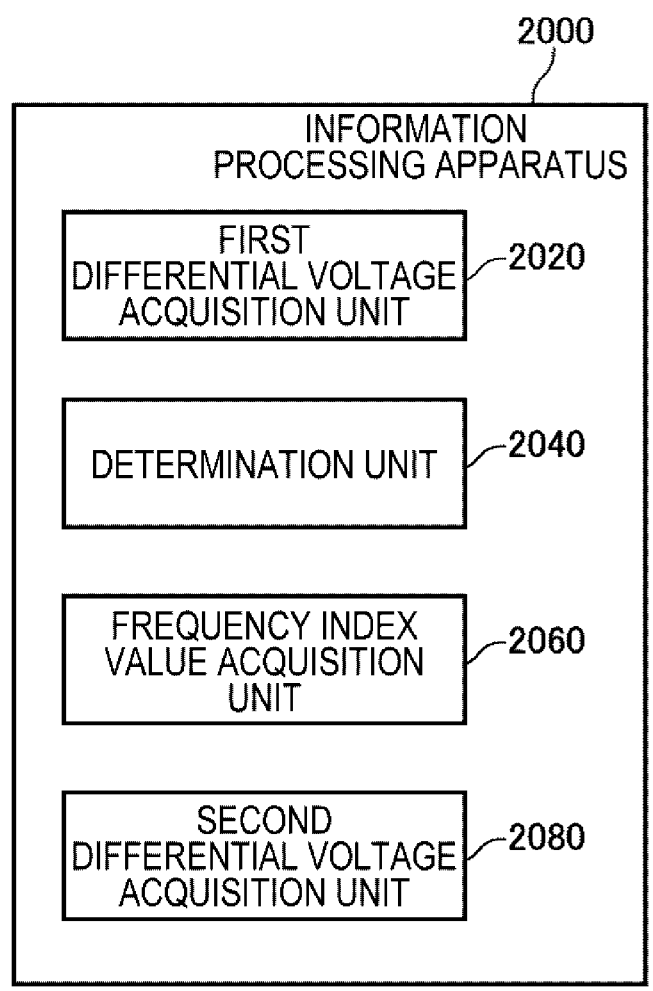
FIG. 13 is a diagram illustrating an information processing apparatus according to Example Embodiment 3.

FIG. 13 is a diagram illustrating an information processing apparatus 2000 according to Example Embodiment 3. The information processing apparatus 2000 of Example Embodiment 3 has the same function as that of the information processing apparatus 2000 of Example Embodiment 2 except for the following description.

The information processing apparatus 2000 according to Example Embodiment 3 has a function of detecting a battery cell 10 that needs a follow-up observation. To do so, the information processing apparatus 2000 according to Example Embodiment 3 includes a second differential voltage acquisition unit 2080. The second differential voltage acquisition unit 2080 acquires a second differential voltage of a battery cell 10. The second differential voltage of the battery cell 10 is a difference between a voltage of the battery cell 10 when charging is completed and a voltage of the battery cell 10 when discharging is completed (for example, a voltage of the battery cell 10 at the time when discharging has been completed). The completion of discharging of the battery cell 10 means that the battery cell 10 is completely discharged.

Here, the "a voltage of a battery cell 10 when discharging is completed" may be a voltage of the battery cell 10 at any time from a time when discharging of the battery cell 10 has been completed to a time when the battery cell 10 has started to be charged. It is preferable that the above-mentioned "a voltage of a battery cell 10 at the time when discharging is completed" is set to "a voltage of a battery cell 10 when discharging has been completed".

Figure 14:
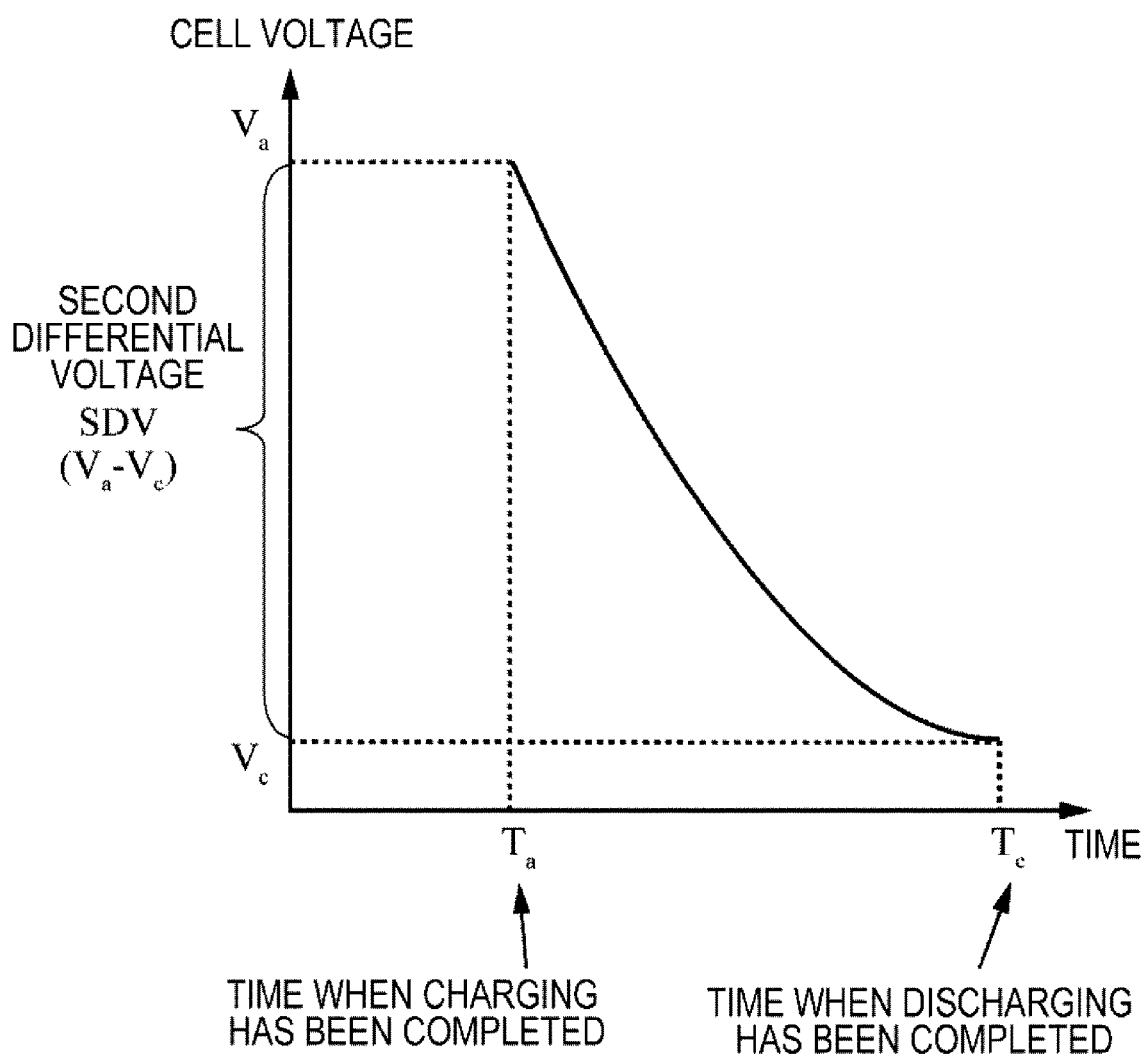
FIG. 14 is a diagram illustrating a second differential voltage.

FIG. 14 is a diagram illustrating the second differential voltage. In FIG. 14, a time $T_a$ is a time when charging of the battery cell 10 is has been completed. A time $T_c$ is a time when discharging of the battery cell 10 has been completed. In FIG. 14, $V_a$ is a voltage of the battery cell 10 at the time $T_a$, $V_c$ is a voltage of the battery cell 10 at the time $T_c$, and SDV is the second differential voltage. Here, SDV is a difference between $V_a$ and $V_c$, i.e. $V_a-V_c$.

The determination unit 2040 determines whether or not a follow-up observation of the first battery cell is necessary based on following three elements, (1) a difference between the first differential voltage of the first battery cell and the first differential voltage of the second battery cell, (2) a frequency index value representing an operation frequency of the cell balance circuit 112 that controls the first battery cell, and (3) a second differential voltage of the first battery cell. Specifically, the determination unit 2040 determines that a follow-up observation of the first battery cell is necessary in a case where (1) a difference between the first differential voltage of the first battery cell and the first differential voltage of the second battery cell is greater than or equal to the first predetermined value, (2) a frequency index value of the cell balance circuit 112 that controls the first battery cell is less than a predetermined frequency, and (3) the second differential voltage of the first battery cell is greater than or equal to a second predetermined value.

A method of calculating and acquiring the second differential voltage is the same as the method of calculating and acquiring the first differential voltage.

The second predetermined value may be set in the determination unit 2040 in advance or may be stored in a storage apparatus accessible from the determination unit 2040. The second predetermined value is, for example, 600 mV.

<Flow of Processing>

Figure 15:
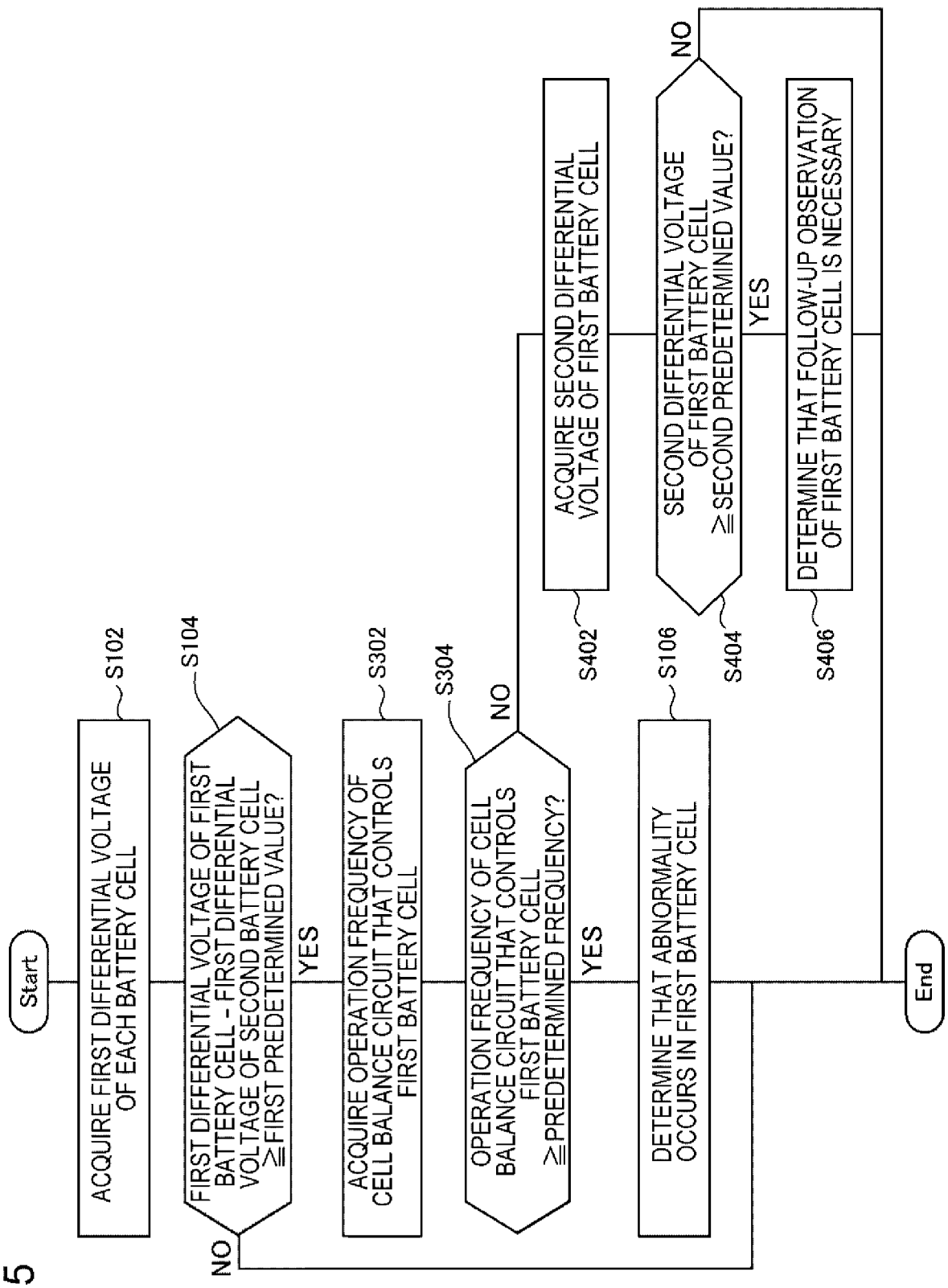
FIG. 15 is a flowchart illustrating a flow of processing executed by the information processing apparatus according to Example Embodiment 3.

FIG. 15 is a flowchart illustrating a flow of processing executed by the information processing apparatus 2000 according to Example Embodiment 3. In FIG. 15, from the step S402 to the steps other than S406 represent the same processing as the steps of the same sign in FIG. 11.

When an operation frequency of the cell balance circuit that controls the first battery cell is less than the predetermined frequency (S304: NO), a process of FIG. 15 proceeds to S402. In S402, the second differential voltage acquisition unit 2080 acquires the second differential voltage of the first battery cell. The determination unit 2040 determines whether or not the second differential voltage of the first battery cell is greater than or equal to the second predetermined value (S404). When the second differential voltage of the first battery cell is greater than or equal to the second predetermined value (S404: YES), the determination unit 2040 determines that a follow-up observation of the first battery cell is necessary (S406).

Note that, the second differential voltage of the first battery cell may not be acquired due to a reason that a timing at which the battery cell 10 in operation is completely discharged is small, or the like. Therefore, when the second differential voltage of the first battery cell cannot be acquired in S402, the determination unit 2040 may determine that a follow-up observation of the first battery cell is necessary.

In addition, when the second differential voltage of the first battery cell is less than the second predetermined value (S404: NO), any handling of the first battery cell may be used. For example, the determination unit 2040 determines that an aging deterioration has occurred in the first battery cell.

Note that, as described in Example Embodiment 1, the determination unit 2040 may sequentially handle each of the plurality of battery cells 10 included in the power storage system 100 as a first battery cell (refer to FIG. 8). In this case, the determination unit 2040 may perform a process after S302 for not only the first battery cell but also each battery cell 10 having the first differential voltage larger than that of the first battery cell. Specifically, in S210 of FIG. 8, the determination unit 2040 performs the process after S302 for each of the plurality of battery cells 10 whose identifiers are included in x[1 . . . i]. Accordingly, even when there are a plurality of battery cells 10 in which abnormalities occur and a plurality of battery cells 10 in which follow-up observations are necessary, it is possible to detect these abnormalities and necessities.

For example, assume that one of the battery cells 10 whose identifier is included in x[1 . . . i] has a battery cell 10-$j$. First, the determination unit 2040 acquires the frequency index value of the cell balance circuit 112 that controls the battery cell 10-$j$ (S302), and determines whether or not the cell balance circuit 112 that controls the battery cell 10-$j$ is greater than or equal to a predetermined frequency (S304). When the cell balance circuit 112 that controls the battery cell 10-$j$ is less than the predetermined frequency (S304: NO), the determination unit 2040 acquires the second differential voltage of the battery cell 10-$j$ (S402) and determines whether or not the second differential voltage of the battery cell 10-$j$ is greater than or equal to the second predetermined value (S404).

When an operation frequency of the cell balance circuit 112 that controls the battery cell 10-$j$ is greater than or equal to the predetermined frequency (S304: YES), the determination unit 2040 determines that an abnormality occurs in the battery cell 10-$j$ (S106). On the other hand, when the second differential voltage of the battery cell 10-$j$ is greater than or equal to the second predetermined value (S404: YES), the determination unit 2040 determines that a follow-up observation of the battery cell 10-$j$ is necessary (S406).

<Hardware Configuration>

The information processing apparatus 2000 according to Example Embodiment 3 is realized by using the computer 1000 as in the Example Embodiment 1 (refer to FIG. 3). In the present example embodiment, each program module stored in the above-mentioned storage 1080 further includes a program for realizing each function described in the example embodiment.

Advantageous Effect

According to the information processing apparatus 2000 of the present example embodiment, not only the battery cell 10 in which an abnormality occurs, but also the battery cell 10 that needs a follow-up observation are detected. Therefore, since a state of the battery cell 10 can be recognized more precisely, it is possible to take appropriate actions according to the state of the battery cell 10.

As mentioned above, the example embodiments of the present invention have been described with reference to the drawings, but these are only examples of the present invention, and combinations of the example embodiments and various configurations other than the example embodiments may be employed.

For example, the determination unit 2040 may determine whether or not the first differential voltage of the first battery cell is a statistically deviated value in view of the first differential voltage of each battery cell 10 included in the power storage system 100, instead of determining whether or not the difference between the first differential voltage of the first battery cell and the first differential voltage of the second battery cell is greater than or equal to the first predetermined value (S104). When the first differential voltage of the first battery cell is a statistically deviated value, the determination unit 2040 performs a process when it is determined that "a difference between the first differential voltage of the first battery cell and the first differential voltage of the second battery cell is greater than or equal to the first predetermined value" (S104: YES).

More specifically, the determination unit 2040 determines whether or not a difference between the first differential voltage of the first battery cell and an average value of the first differential voltages of all the battery cells 10 included in the power storage system 100 is greater than or equal to a predetermined value. The predetermined value is, for example, $3\sigma$. Note that, $\sigma$ is a standard deviation of the first differential voltage of all the battery cells 10 included in the power storage system 100.

The invention claimed is:

1. An information processing apparatus, comprising:
a first differential voltage acquisition unit acquiring, for each of a plurality of battery cells connected in series, a first differential voltage which is a difference between a voltage after charging is completed and a voltage at a time when an operation is performed for a predetermined time after charging is completed; and
a determination unit determining that an abnormality occurs in a first battery cell, in a case where a difference between the first differential voltage of the first battery cell and the first differential voltage of a second battery cell is greater than or equal to a first predetermined value, the second battery cell having a next largest first differential voltage to the first battery cell.

2. The information processing apparatus according to claim 1, wherein the first battery cell is the battery cell having a largest first differential voltage.

3. The information processing apparatus according to claim 1, wherein, in a case where it is determined that an abnormality occurs in the first battery cell, the determination unit determines that abnormalities also occur in other battery cells having the first differential voltage larger than the first differential voltage of the first battery cell.

4. The information processing apparatus according to claim 1, further comprising a frequency index value acquisition unit acquiring a frequency index value representing an operation frequency of a cell balance circuit that controls the battery cell,
wherein the determination unit determines that an abnormality occurs in the first battery cell, in a case where a difference between the first differential voltage of the first battery cell and the first differential voltage of the second battery cell having the next largest first differential voltage of the first battery cell is greater than or equal to the first predetermined value, and the operation frequency of the cell balance circuit that controls the first battery cell is greater than or equal to a predetermined frequency.

5. The information processing apparatus according to claim 4, further comprising a second differential voltage acquisition unit acquiring, for each of the battery cells, a second differential voltage which is a difference between a voltage after charging is completed and a voltage after discharging is completed, wherein the determination unit determines that a follow-up observation of the first battery cell is necessary, in a case where a difference between the first differential voltage of the first battery cell and the first differential voltage of the second battery cell having the next largest first differential voltage of the first battery cell is greater than or equal to the first predetermined value, the operation frequency of the cell balance circuit that controls the first battery cell is less than the predetermined frequency, and the second differential voltage of the first battery cell is greater than or equal to a second predetermined value.

6. A control method executed by a computer, the method comprising:

acquiring, for each of a plurality of battery cells connected in series, a first differential voltage which is a difference between a voltage after charging is completed and a voltage at a time when an operation is performed for a predetermined time after charging is completed; and determining that an abnormality occurs in a first battery cell, in a case where a difference between the first differential voltage of the first battery cell and the first differential voltage of a second battery cell is greater than or equal to a first predetermined value, the second battery cell having a next largest first differential voltage of the first battery cell.

7. The control method according to claim 6, wherein the first battery cell is the battery cell having a largest first differential voltage.

8. The control method according to claim 6, wherein, in a case where it is determined that an abnormality occurs in the first battery cell, determining that abnormalities also occur in the other battery cells having the first differential voltage larger than the first differential voltage of the first battery cell.

9. The control method according to claim 6, further comprising acquiring a frequency index value representing an operation frequency of a cell balance circuit that controls the battery cell, wherein determining that an abnormality occurs in the first battery cell, in a case where a difference between the first differential voltage of the first battery cell and the first differential voltage of the second battery cell having the next largest first differential voltage of the first battery cell is greater than or equal to the first predetermined value, and the operation frequency of the cell balance circuit that controls the first battery cell is greater than or equal to a predetermined frequency.

10. The control method according to claim 9, further comprising acquiring, for each of the battery cells, a second differential voltage which is a difference between a voltage after charging is completed and a voltage after discharging is completed, wherein determining that a follow-up observation of the first battery cell is necessary, in a case where a difference between the first differential voltage of the first battery cell and the first differential voltage of the second battery cell having the next largest first differential voltage of the first battery cell is greater than or equal to the first predetermined value, the operation frequency of the cell balance circuit that controls the first battery cell is less than the predetermined frequency, and the second differential voltage of the first battery cell is greater than or equal to a second predetermined value.

11. A non-transitory computer-readable storage medium comprising a program causing a computer to execute each step of the control method according to claim 6.

* * * * *